United States Patent [19]

Senzaki

[11] 4,182,429

[45] Jan. 8, 1980

[54] LOUD-SPEAKER SYSTEM

[75] Inventor: Hiroshi Senzaki, Hachioji, Japan

[73] Assignee: Kabushiki Kaisha Senzaki Seisakusho, Hachioji, Japan

[21] Appl. No.: 880,190

[22] Filed: Feb. 22, 1978

[30] Foreign Application Priority Data

Dec. 29, 1977 [JP] Japan ............................... 176834[U]

[51] Int. Cl.[2] ......................... H05K 5/00; H04R 13/02

[52] U.S. Cl. ............................ 181/144; 179/115.5 PS; 179/116; 181/141

[58] Field of Search ............... 181/141, 144, 145, 147, 181/148, 150; 179/1 E, 1 VE, 115.5 PS, 116

[56] References Cited

U.S. PATENT DOCUMENTS

| | | | |
|---|---|---|---|
| 1,866,831 | 7/1932 | Wolff et al. | 181/147 |
| 2,073,747 | 3/1937 | Koroncai et al. | 181/148 |
| 2,259,907 | 10/1941 | Olney | 179/115.5 PS |
| 2,593,031 | 4/1952 | Howatt | 179/116 |
| 3,379,276 | 4/1968 | Goettl | 181/154 |
| 3,754,618 | 8/1973 | Sasaki | 181/145 |

*Primary Examiner*—Stephen J. Tomsky

*Attorney, Agent, or Firm*—Larson, Taylor and Hinds

[57] ABSTRACT

A loud-speaker system comprising at least a loud-speaker means for high sound with a loud-speaker means for low sounds arranged substantially coaxially thereto is provided in which the loud-speaker means for high sounds is adjustably mounted to the loud-speaker means for low sounds so that the position of the former can be adjusted relative to that of the latter in order to compensate for the directional characteristics of the former relative to the location of the listener.

6 Claims, 6 Drawing Figures

LOUD-SPEAKER SYSTEM

BACKGROUND OF THE INVENTION

The present invention relates to a loud-speaker system, and more particularly to a loud-speaker system comprising at least a loud-speaker means for high sounds with a loud-speaker means for low sounds arranged substantially coaxially thereto.

For example, in a passenger car, loud-speakers for a car stereo are generally mounted at the rear deck of the car, i.e. between the rear seat and the rear window. They may possibly be mounted in the doors, or below the front panel, etc., but they are most usually mounted at the rear deck. In this case, there are generally two ways of mounting the loud-speakers. That is, in one way they are mounted on rear deck in such a manner that the cabinets of the loud-speaker are directed forwards so that the loud-speakers protrude forward. In the other way they are substantially set in the rear deck with only their front portions exposed above the uppe surface of the rear deck, or the cabinets are wholly set in the rear deck in a upright position and openings are provided in the upper surface of the rear deck in line with the axes of the loud-speakers.

Recently, in order to keep the interior space of the car as large as possible the latter way has been widely adopted. However, in this case, since the fronts of the loud-speakers are placed so as to be directed upwards, when conventional loud-speakers each comprising a loud-speaker means for high sounds and a loud-speaker for low sounds are used as they are, their performance cannot be fully realized. That is, since the loud-speakers are mounted upwards, the sound issued from them is directed towards the car ceiling so that the listeners inside the car have to hear the sound reflected off the ceiling. Generally the directivity of a loud-speaker becomes sharper as the frequency of the sound becomes higher, i.e. as the sound becomes higher. Therefore, in the case of mounting the loud-speakers upwards in a car in the rear deck as above indicated, the characteristics of the higher range of sounds deteriorates so that even though e.g. co-axial loud-speakers having high performance are used the sound actually reached the ears of the listeners is not very good.

SUMMARY OF THE INVENTION

It is a principal object of the present invention to provide a loud-speaker system particularly suitable for use in passenger car stereo systems which exhibits high performance even when the front of the loud-speakers are not set towards the listener.

It is another object of the present invention to provide a loud-speaker system of the coaxial type particularly suitable for use in passenger car stereo systems which exhibits high performance in particular in the range of the higher sounds even when the front of the coaxial loud-speaker is not directed toward the listener.

According to the present invention a loud-speaker system comprising at least a loud-speaker means for high sounds, i.e. a tweeter, with a loud-speaker means for low sounds, i.e. a woofer, arranged coaxially to the former is provided wherein the loud-speaker means for high sounds is adjustably mounted to the loud-speaker means for low sounds in order to allow manual regulation of the position of the former relative to that of the latter.

BRIEF DESCRIPTION OF THE DRAWINGS

These and other objects of this invention will become more readily apparent upon a reading of the following specification and upon reference to the accompanying drawings, in which.

DESCRIPTION OF THE PREFERRED EMBODIMENT

Figure 1:
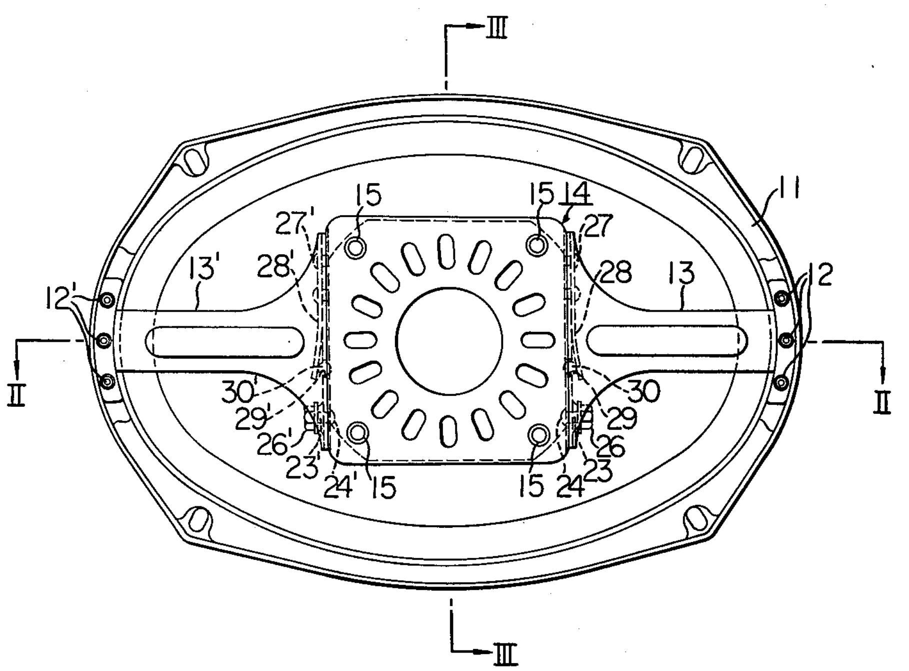
FIG. 1 is a plan view of one of the embodiments of the present invention.
Figure 2:
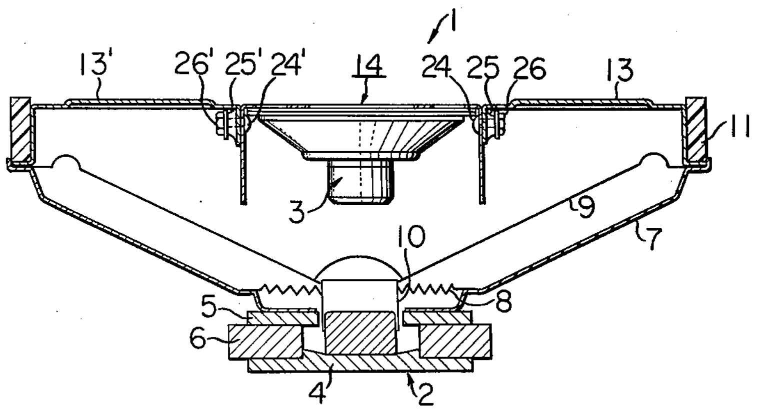
FIG. 2 is a sectional view taken along the line II—II of FIG. 1.
Figure 3:
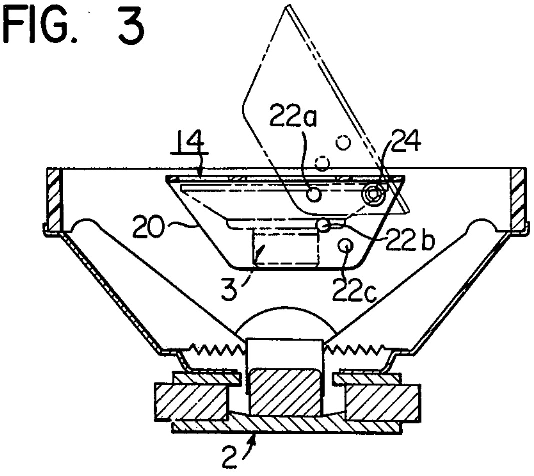
FIG. 3 is a sectional view taken along the line III—III of FIG. 1.
Figure 5:
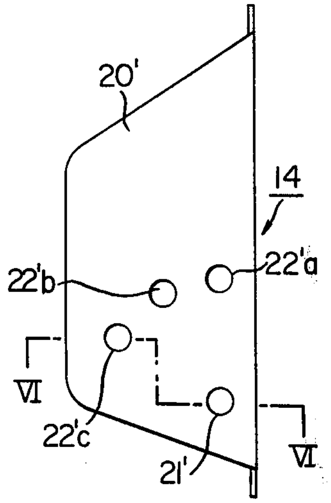
FIG. 5 is a side view of the holding plate shown in FIG. 4.
Figure 4:
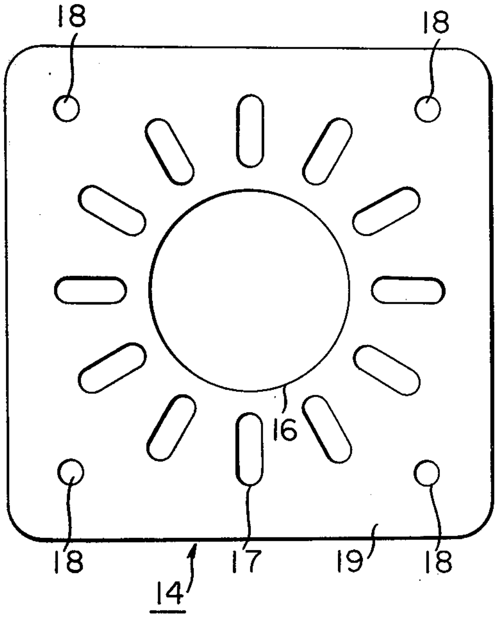
FIG. 4 is a plan view of the loud-speaker holding plate shown in FIGS. 1 to 3 on a larger scale.
Figure 6:
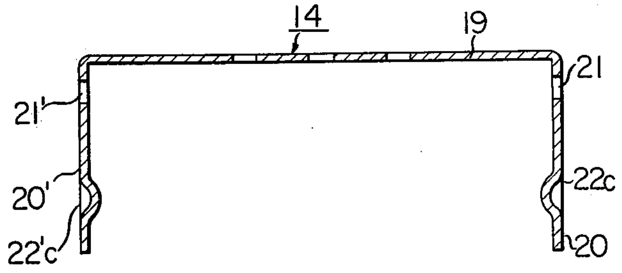
FIG. 6 is a sectional view taken along the line VI—VI of FIG. 5.

Referring now to FIGS. 1 to 3, a preferred embodiment of the loud-speaker system according to the present invention generally designated by the reference numeral 1 comprises a loud-speaker member 2 for a low sound or woofer speaker with a loud-speaker member 3 for high sounds or tweeter speaker disposed substantially coaxially to the woofer. Thus the loud-speaker system illustrated represents a system of the coaxial, two way type. The loud-speaker member 2 for low sounds is of the well known moving coil type comprising a magnet 6 disposed between a bottom plate 4 and a top plate 5, a frame 7 secured to the top plate 5, a coil 10 supported by the top plate 5 though a damper 8, a cone 9 connected to the coil 10, and a gasket 11 connected to the outer periphery of the cone 9, etc., but since this member 2 has no direct relation with the present invention its detailed explanation is omitted here. The loud-speaker member 3 for high sounds is mounted to a loud-speaker support plate 14 by rivets 15 or the like, which support plate in turn is held in position by a pair of metalic bridge members 13, 13′ each secured at its one end to the outer periphery of the frame 7 by screws 12, 12′ with its other end being bent downwards at right angles so as to present a plain web portion, the web portions confronting each other with a predetermined space being left therebetween. The web portions are also provided with a pair of aligning holes 23, 23′ as shown in FIG. 1 for the object to be described fully later. As shown in FIGS. 4 to 6, the loud-speaker support plate 14 is preferably made of a metal plate and comprises a flat plate portion 19 which is generally square in shape and which has a length substantially corresponding to the space between the web portions of the bridge members 13, 13′. The flat plate portion 19 has a hole 16 as well as a number of peripheral slots 17 for the purpose of passing through the high sounds issued from the high-sound loud-speaker 3, and also a number of holes 18 to secure it to the loud-speaker member 3 by means of rivets 15, etc. The support plate 14 has also a pair of side plate portions 20, 20′ which are integrally formed from the flat plate portion 19 at one of its pairs of opposite edges so as to be orthogonal to its surface. In the side plate portions 20, 20′ of the support plate 14 aligning holes 21, 21′ for pivotally securing the support plate to the bridge numbers 13, 13′ at the web portions thereof are respectively formed at appropriate positions, and also several approximately equally spaced semi-spherical detents 22a, 22b, 22c and 22'a, 22'b, 22'c are respectively formed in two arcs which are centered at the center of the aligning holes 21, 21', respectively, whereby the respective detents 22a, 22b, 22c and 22'a, 22'b, 22'c are preferably disposed so as not align with each other in the direction connecting the centers of the holes 21, 21', or, in other words, the positions of the detents are staggered in the above direction between the confronting side plate portions 20, 20'. Alternately, the detents may be replaced by through holes having an appropriate diameter. The loud-speaker support plate 14 is pivotally secured to the bridge members 13, 13' at the web portions thereof by means of setscrews 24, 24' passed through their corresponding holes 21, 21' and 23, 23' as well as by nuts 26, 26' and spring washers 25, 25' disposed between the nuts 26, 26' and the inner surfaces of the web portions of the bridge members 13, 13'. Thus the loud-speaker support plate 14 can be resiliently pivoted about the centers of the setscrews 24, 24'. In this case, as shown in FIG. 1, the pivotal movement of support plate 14 is carried out stepwise by the alternate engagement of balls 30, 30' held in holes 29, 29' formed in the web portions of the bridge members 13, 13' with the detents or through holes 22a, 22b, 22c and 22'a, 22'b, 22'c formed in the side plate portions 20, 20' of the loud-speaker support plate 14. More completely, as shown in FIG. 1, the balls 30, 30' are loosely held in the holes 29, 29' respectively formed in the web portions of the bridge members 13, 13' which confront the side plate portions 20, 20' respectively of the loud-speaker support plate 14 so as to fall on the arc in which the detents are positioned, whereby the balls 30, 30' are held in position by the action of leaf springs 28, 28', respectively, secured at one end to the bridge members 13, 13'. Thus, when either of the balls 29, 29' engages one of the detents or through holes 22a, 22b, 22c and 22'a, 22'b, 22'c, which are non-aligned with each other in the opposite portions 21, 21', in cooperation with the leaf springs 28, 28', movement of the loud-speaker support plate 14 relative to the bridge members 13, 13' due to vibration, shock, etc. of the car is effectively prevented, and when the rigidity of the leaf springs 28, 28' is selected to be a suitable one the loud-speaker support plate 14 is allowed to be pivoted manually together with the loud-speaker member 3.

Having thus far explained the constitution of the present invention now its operation will be explained below.

As shown in FIG. 3 by the solid lines, when the loud-speaker 1 is set e.g. in the rear deck of a passenger car so that its front is directed upwards, and the balls 30, 30' in the bridge members 13, 13' are made to be engaged with the uppermost detents or through holes 22a, 22'a in the side plate portions 20, 20' of the loud-speaker support plate 14, the front of the loud-speaker 3 for high sounds is also directed upwards. In this case, when it is desired to direct the loud-speaker 3 towards the listeners, who are sitting inside the car, e.g. to the right as viewed in FIG. 3, for the object of compensating for the directivity of the loud-speaker 3, the loud-speaker 3 is pivoted in the clockwise direction about the center of the set screws 24, 24' through the support plate 14 so that either the ball 30 or the ball 30' engages with the detents 22b or 22'b. In this case, for reasons of the shape, etc. of the car compartment, if it is desired to pivot the loud-speaker 3 for high sounds further, the loud-speaker support plate 14 is pivoted further until either of the balls 30, 30' engages the detents 22c or 22c' as shown in FIG. 3 by dot-dash lines.

Although, in the foregoing, as one embodiment of the present invention the number of detents 22, 22' was referred to as being three each, they are not restricted to this number; instead more may be selected if desired. Further, the mechanism for arresting the loud-speaker support plate 14 against the bridge members 13, 13' is not restricted to the one comprising the detents or through holes 22, 22', the balls 30, 30' and the leaf springs 28, 28' as above described. That is, any mechanism so far as it can effectively prevent the movement of the loud-speaker support plate 14 relative to the bridge members 13, 13' and yet allow a manual pivotal movement when so desired can be adopted for the same purpose. Thus, e.g. suitable means which gives proper frictional force between the loud-speaker support plate 14 and the bridge members 13, 13' is equally applicable. Moreover it will be appreciated that the present invention can be equally applied to a three or more way loud-speaker system instead of the two-way system which was fully explained above, and also to a loud-speaker for a home stereo system in addition to one for a passenger car stereo system.

What is claimed is:

1. A loud-speaker system comprising at least a first loud-speaker means for low sounds and at least a second loud-speaker means for high sounds arranged substantially coaxially with respect to said first loud-speaker in the rest position of the second loud-speaker said system further comprising pivotable mounting means pivotably mounting said loud-speaker means for high sounds relative to the frame of said loud-speaker means for low sounds so as to permit pivoting of said loud-speaker means for high sounds from said rest position and thereby varying the direction of the high sounds from said loud-speaker means for high sounds, said mounting means being disposed substantially in the plane of the mouth of said first loud-speaker.

2. A loud-speaker system as claimed in claim 1 wherein said loud-speaker means for high sounds is secured to a support plate, said support plate being adjustably mounted to said loud-speaker means for low sounds through a pair of bridge members which are secured to a frame of said loud-speaker means for low sounds.

3. A loud-speaker system as claimed in claim 2 wherein each of said bridge members has generally a plate like configuration with one end being bent downwards at right angles so as to give a plain web portion and the other end being rigidly secured to said frame so that said web portions confront each other with a space being left therebetween, said support plate having generally a square shape with a pair of side plate portions being depended at right angles from its opposite edges, said support plate being disposed within said space and pivotally mounted at said side plate portions to bridge members at said web portions.

4. A loud-speaker system as claimed in claim 3 wherein a number of approximately equally spaced detents or through holes are formed in said side plate portions in an arc the center of which coincides with the pivotal point of said side plate portions to said web portions, and ball means is loosely fit within a hole provided in each of said web portions so that said hole lies on said arc, said ball means being adapted to be resiliently held in both said hole and one of said detents or through holes by the action of spring means secured to said web portions.

5. A loud-speaker system as claimed in claim 4 wherein the positions of said detents or through holes are staggered between each said side plate portions of said support plate so that none of them aligns on a line parallel to the line connecting the centers of said pivotal points.

6. A loud-speaker system as claimed in claim 1 wherein said pivotable mounting means comprises means defining an offset pivot axis disposed generally adjacent to one edge of said loud-speaker means for high sounds.

* * * * *